(12) United States Patent
Rhodes

(10) Patent No.: US 7,259,413 B2
(45) Date of Patent: Aug. 21, 2007

(54) HIGH DYNAMIC RANGE IMAGE SENSOR

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 214 days.

(21) Appl. No.: 10/950,927

(22) Filed: Sep. 28, 2004

(65) Prior Publication Data

US 2006/0071254 A1     Apr. 6, 2006

(51) Int. Cl.
*H01L 31/062* (2006.01)
(52) U.S. Cl. ........................ 257/292; 257/291
(58) Field of Classification Search ............... 257/291, 257/292
See application file for complete search history.

(56) References Cited

U.S. PATENT DOCUMENTS

| 6,040,570 A | 3/2000 | Levine et al. |
| 6,101,294 A | 8/2000 | McCaffrey et al. |
| 6,441,852 B1 | 8/2002 | Levine et al. |
| 6,472,653 B1 | 10/2002 | Levine et al. |
| 7,102,184 B2 * | 9/2006 | Rhodes ........................ 257/292 |
| 2005/0179072 A1 * | 8/2005 | Rhodes ........................ 257/291 |

* cited by examiner

*Primary Examiner*—Roy Potter
(74) *Attorney, Agent, or Firm*—Dickstein Shapiro LLP

(57) ABSTRACT

A pixel cell with controlled leakage is formed by modifying the location and gate profile of a high dynamic range (HDR) transistor. The HDR transistor may have a dual purpose, acting as both a leaking transistor and either a transfer gate or a reset gate. Alternatively, the HDR transistor may be a separate and individual transistor having the gate profile of a transfer gate or a reset gate. The leakage through the HDR transistor may be controlled by modifying the photodiode implants around the transistor, adjusting the channel length of the transistor, or thinning the gate oxide on the transistor. The leakage through the HDR transistor may also be controlled by applying a voltage across the transistor.

23 Claims, 15 Drawing Sheets

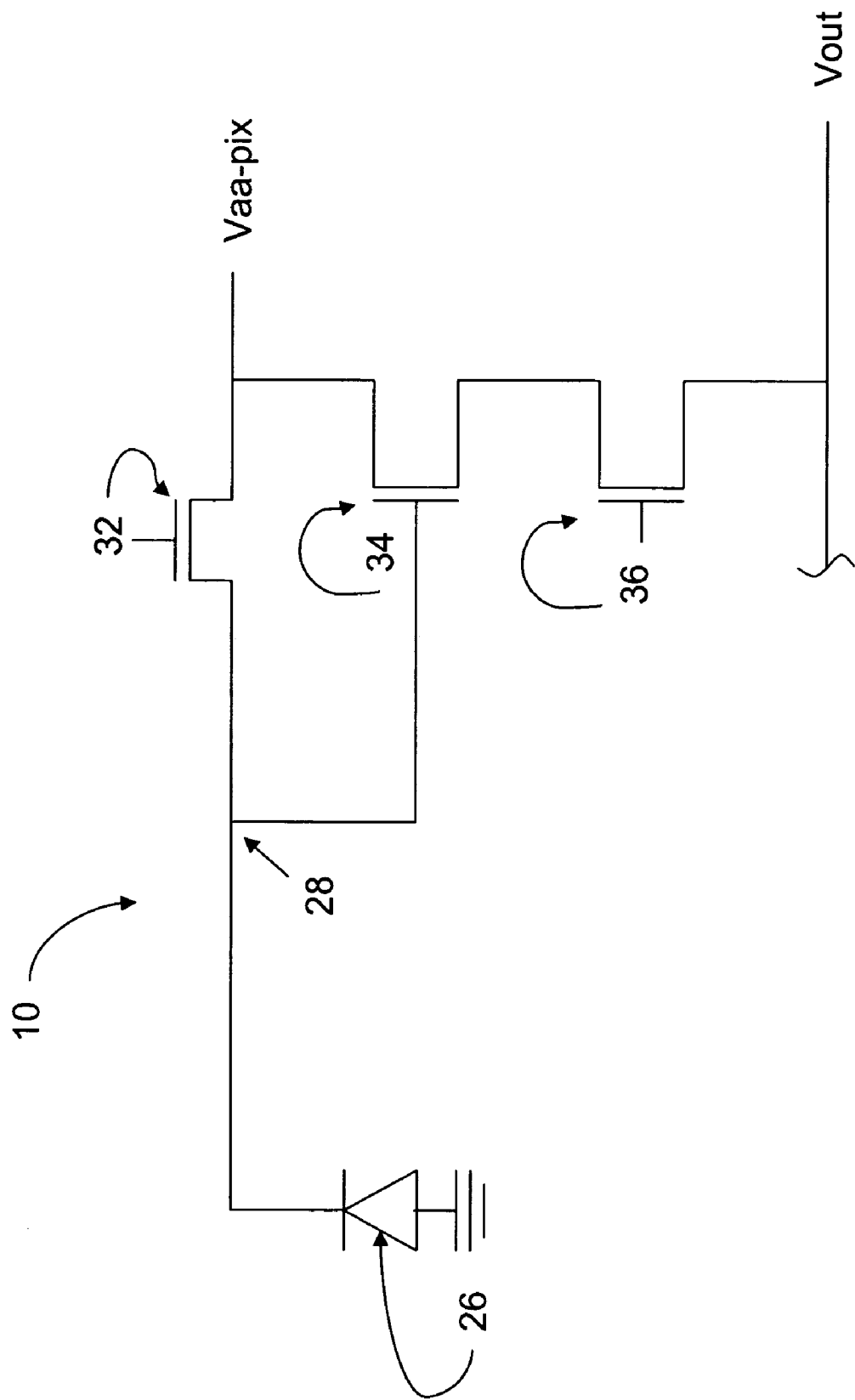

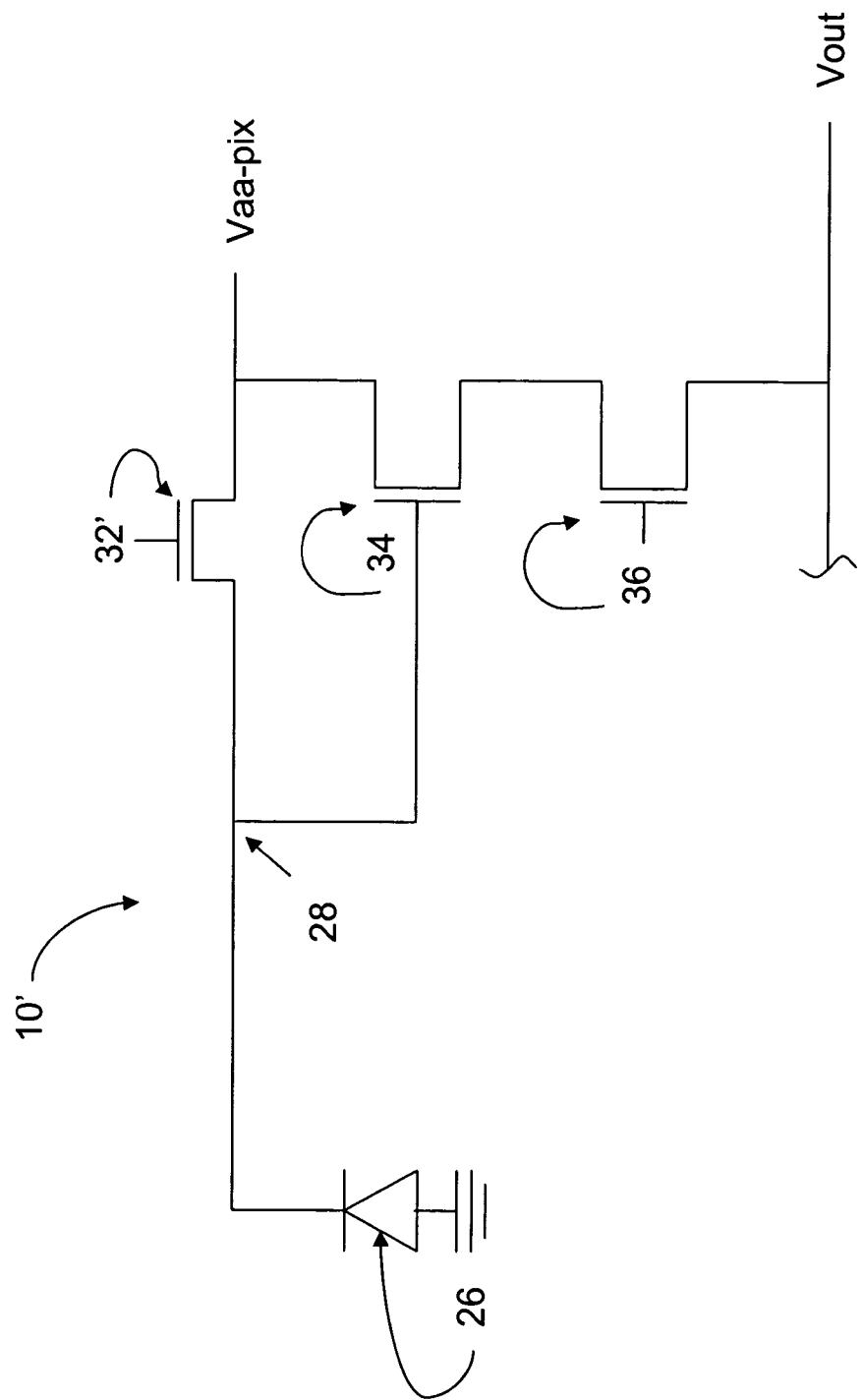

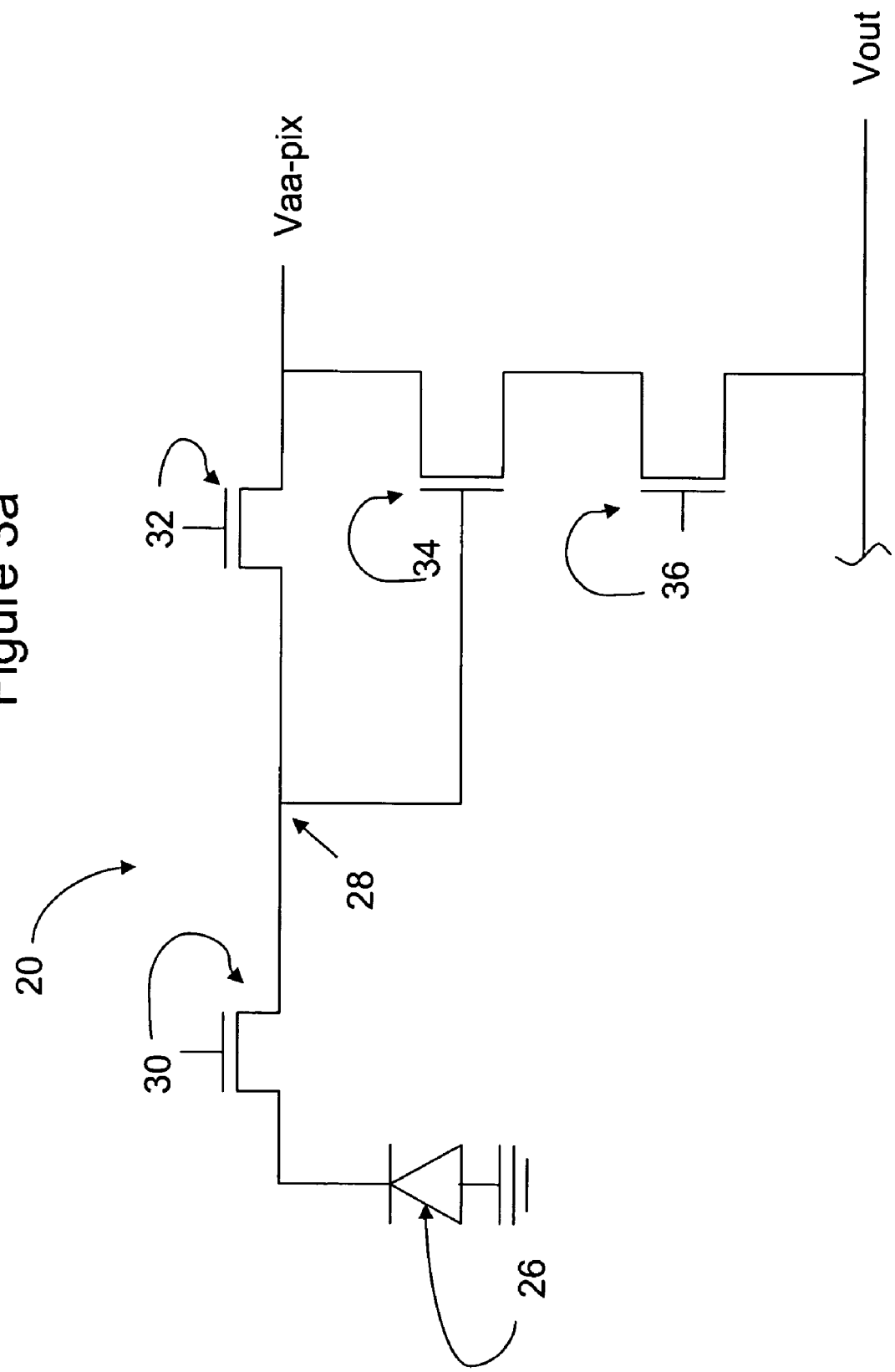

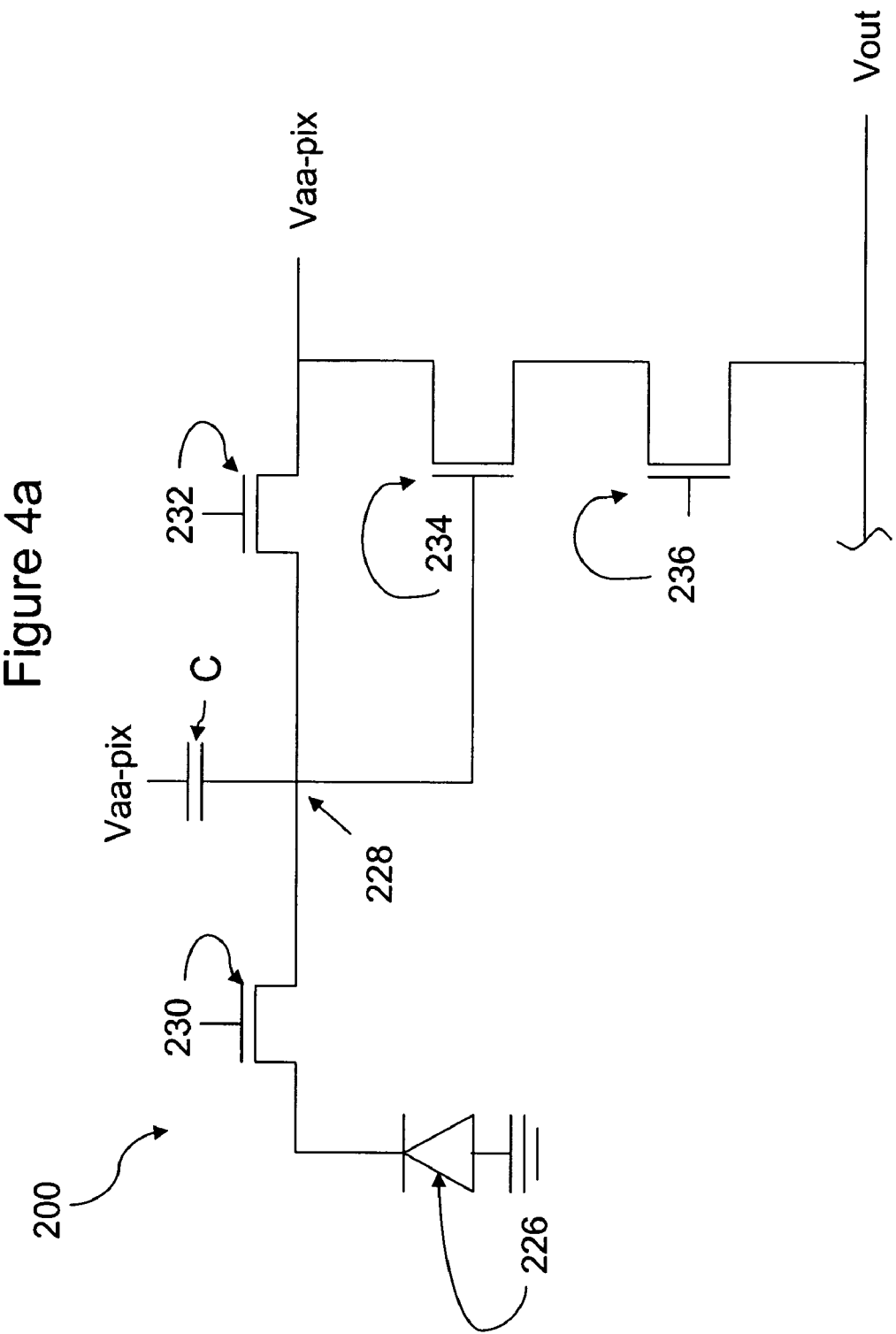

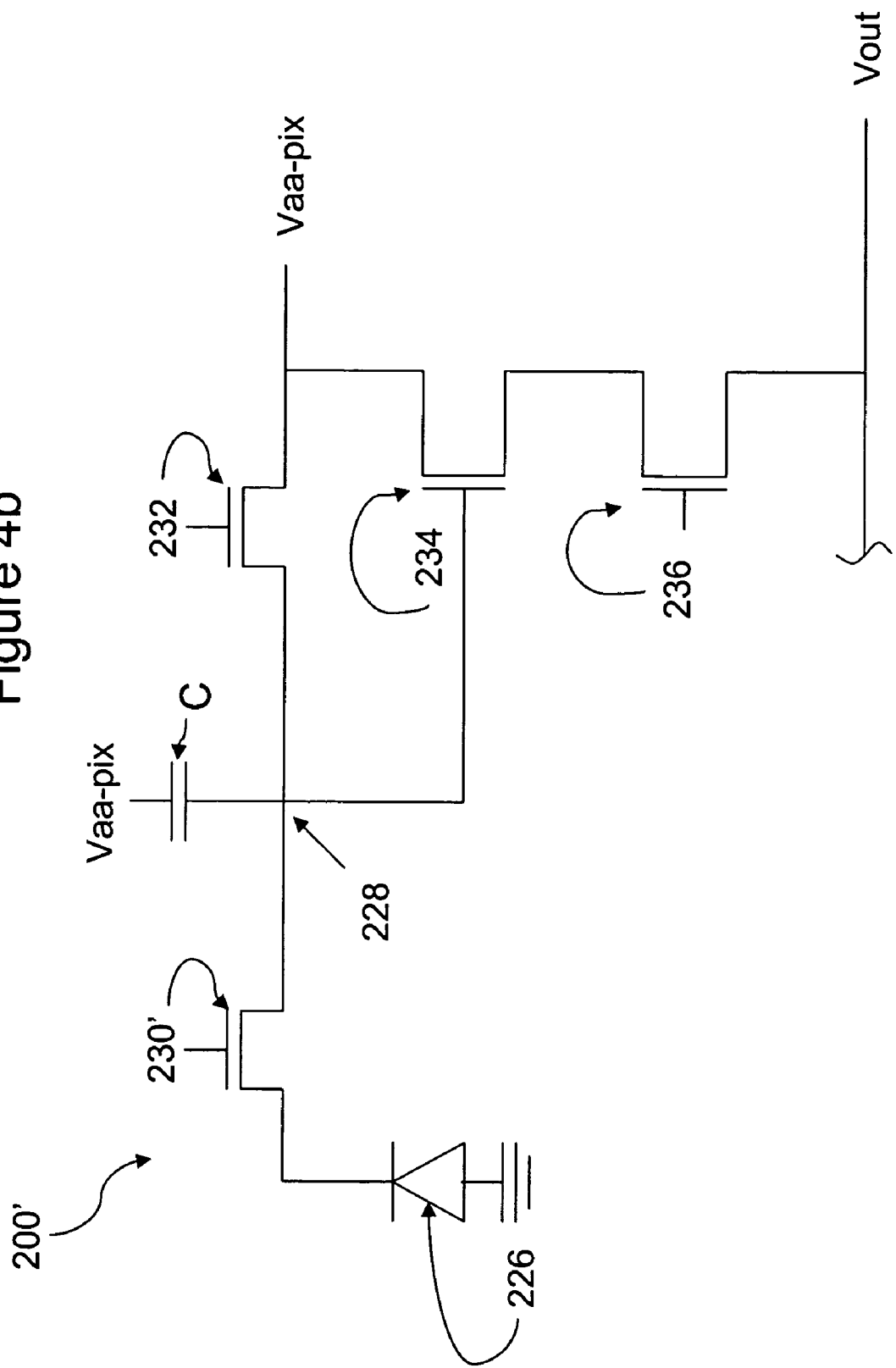

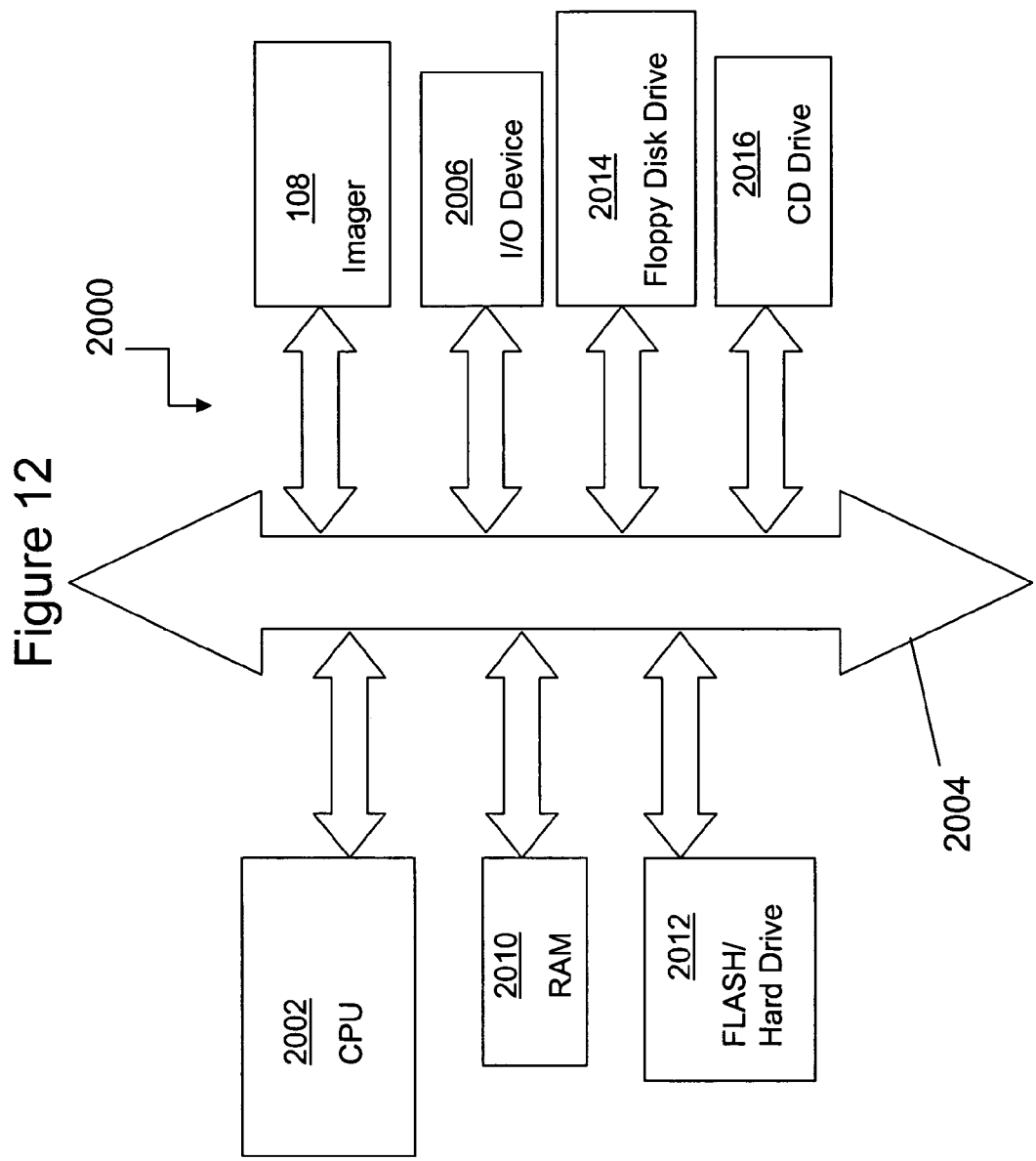

HIGH DYNAMIC RANGE IMAGE SENSOR

FIELD OF THE INVENTION

The present invention relates to the field of semiconductor devices and, in particular, to a pixel cell transistor that improves dynamic range, and provides anti-blooming properties for the cell.

BACKGROUND OF THE INVENTION

A CMOS imager circuit includes a focal plane array of pixel cells, each cell includes a photosensor, for example, a photogate, photoconductor or a photodiode overlying a substrate for producing a photo-generated charge in a doped region of the substrate. A readout circuit is provided for each pixel cell and includes at least a source follower transistor and a row select transistor for coupling the source follower transistor to a column output line. The pixel cell also typically has a floating diffusion region, connected to the gate of the source follower transistor. Charge generated by the photosensor is sent to the floating diffusion region. The imager may also include a transistor for transferring charge from the photosensor to the floating diffusion region and another transistor for resetting the floating diffusion region to a predetermined charge level prior to charge transference.

In a CMOS imager, the active elements of a pixel cell, for example a four transistor pixel, perform the necessary functions of (1) photon to charge conversion; (2) transfer of charge to the floating diffusion node; (3) resetting the floating diffusion node to a known state before the transfer of charge to it; (4) selection of a pixel cell for readout; and (5) output and amplification of a signal representing a reset voltage and a pixel signal voltage based on the photo converted charges. The charge at the floating diffusion node is converted to a pixel output voltage by a source follower output transistor.

FIG. 1 illustrates a block diagram of a CMOS imager device 108 having a pixel array 100 with each pixel cell being constructed as described above. Pixel array 100 comprises a plurality of pixels arranged in a predetermined number of columns and rows (not shown). The pixels of each row in array 100 are all turned on at the same time by a row select line, and the pixels of each column are selectively output by respective column select lines. A plurality of row and column lines are provided for the entire array 100. The row lines are selectively activated by the row driver 145 in response to row address decoder 155 and the column select lines are selectively activated by the column driver 160 in response to column address decoder 170. Thus, a row and column address is provided for each pixel.

The CMOS imager 108 is operated by the control circuit 150, which controls address decoders 155, 170 for selecting the appropriate row and column lines for pixel readout, and row and column driver circuitry 145, 160 that apply driving voltage to the drive transistors of the selected row and column lines. The pixel column signals, which typically include a pixel reset signal Vrst and a pixel image signal Vsig for each pixel are read by sample and hold circuitry 161 associated with the column driver 160. A differential signal Vrst-Vsig is produced and amplified by amplifier 162 and digitized by analog-to-digital converter 175. The analog-to-digital converter 175 converts the analog pixel signals to digital signals, which are fed to an image processor 180 to form and output a digital image.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

A schematic diagram of an exemplary CMOS three-transistor (3T) pixel cell 10 is illustrated in FIG. 2a. The three transistors include a reset transistor 32, a source follower transistor 34, and a row select transistor 36. A photosensor 26 converts incident light into charge. A floating diffusion region 28 receives charge from the photosensor 26 and is connected to the reset transistor 32 and the gate of the source follower transistor 34. The source follower transistor 34 outputs a signal proportional to the charge accumulated in the floating diffusion region 28 to a sampling circuit when the row select transistor 36 is turned on. The reset transistor 32 resets the floating diffusion region 28 to a known potential prior to transfer of charge from the photosensor 26. The photosensor 26 may be a photodiode, a photogate, or a photoconductor. If a photodiode is employed, the photodiode may be formed below a surface of the substrate and may be a buried p-n-p photodiode, buried n-p-n photodiode, buried p-n photodiode, or buried n-p photodiode, among others.

A schematic diagram of an exemplary CMOS four-transistor (4T) pixel cell 20 is illustrated in FIG. 3a. The four transistors include a transfer gate 30, a reset transistor 32, a source follower transistor 34, and a row select transistor 36. A photosensor 26 converts incident light into charge. A floating diffusion region 28 receives charge from the photosensor 26 through the transfer gate 30 (when activated) and is connected to the reset transistor 32 and the gate of the source follower transistor 34. The source follower transistor 34 outputs a signal proportional to the charge accumulated in the floating diffusion region 28 to a sampling circuit when the row select transistor 36 is turned on. The reset transistor 32 resets the floating diffusion region 28 to a known potential prior to transfer of charge from the photosensor 26. Similar to the 3T pixel cell 10 of FIG. 2a, the illustrated photosensor 26 may be a photodiode, a photogate, or a photoconductor. If a photodiode is employed, the photodiode may be formed below a surface of the substrate and may be a buried p-n-p photodiode, buried n-p-n photodiode, a buried p-n photodiode, or a buried n-p photodiode, among others.

A capacitor may also be connected to the floating diffusion node in order to increase the storage capacity as shown in FIG. 4a. In FIG. 4a, the pixel 200 has a capacitor C connected to floating diffusion node 228, to receive charge from the photosensor 226. The remainder of the pixel 200 is similar to the 4T pixel illustrated in FIG. 3a.

Image sensors, such as an image sensor employing the conventional pixel cells 10, 20, 200 of FIGS. 2a, 3a and 4a, as well as sensors employing other pixel cell architectures, have a characteristic light dynamic range. Light dynamic range refers to the range of incident light that can be accommodated by an image sensor in a single frame of pixel data. It is desirable to have an image sensor with a high light dynamic range to image scenes that generate high light dynamic range incident signals, such as indoor rooms with windows to the outside, outdoor scenes with mixed shadows and bright sunshine, night-time scenes combining artificial lighting and shadows, and many others.

The electrical dynamic range for an image sensor is commonly defined as the ratio of its largest non-saturating signal to the standard deviation of the noise under dark conditions. The electrical dynamic range is limited on an upper end by the charge saturation level of the sensor, and on a lower end by noise imposed limitations and/or quantization limits of the analog to digital converter used to produce the digital image. When the light dynamic range of an image sensor is too small to accommodate the variations in light intensities of the imaged scene, e.g. by having a low light saturation level, the full range of the image scene is not reproduced. The illumination-voltage profile of the conventional pixels 10, 20 is typically linear as shown in FIG. 7, which illustrates an illumination v. voltage graph of a prior art pixel cell. A pixel cell's maximum voltage $V_{out-max}$ may be reached at a relatively low level of illumination $I_{max-1}$ which causes the pixel cell to be easily saturated, thus limiting the dynamic range of the pixel. The relationship between electrical dynamic range and light dynamic range is shown in FIGS. 7 and 8.

When the incident light captured and converted into a charge by the photosensor during an integration period is greater than the capacity of the photosensor, excess charge may overflow and be transferred to adjacent pixels. This undesirable phenomenon is known as blooming, or charge cross talk, and results in a bright spot in the output image.

Another problem of image sensors is that the reset gate adjacent to the photosensor in three-transistor (3T) pixels or the transfer gate adjacent to the photosensor in four-transistor (4T) pixels tend to leak, creating signal loss from the photosensor during the integration period. Independent of the dynamic range problem, a substantial effort is being made in the art of image sensors to reduce or eliminate off-state leakage of adjacent transistors to minimize signal loss.

Thus, there is a desire and need for a pixel cell having improved saturation response and lower potential for blooming while benefiting from the leaky property of transistors.

BRIEF SUMMARY OF THE INVENTION

Exemplary embodiments of the invention provide a pixel cell capable of reaching a higher level of illumination before its maximum output voltage is reached. The pixel cell has controlled photosensor leakage. Exemplary embodiments of the present invention drain some of the charge generated by the photosensor away from the photosensor during an integration period through a transistor adjacent to the photosensor acting as a high dynamic range (HDR) transistor. The HDR transistor may be a "leaky" reset transistor in the case of a 3T pixel, a "leaky" transfer gate in the case of a 4T pixel, or it may be an additional anti-blooming transistor adjacent to the photosensor in the case of a 4T or 5T pixel as described in U.S. patent application Ser. No. 10/881,525 (M4065.0955, filed Jul. 1, 2004) to Rhodes. This prevents the photosensor from becoming over-saturated and excess charges from overflowing to adjacent pixels.

Embodiments employing the novel HDR transistor of the invention alters the pixel output signal characteristic curve and can increase the dynamic range of the pixel cell.

The HDR transistor may also be used as a global shutter gate, which enables independent resetting of the photosensor. The HDR transistor, as an additional anti-blooming transistor, may have the same doping profile as a transfer gate or reset gate of a pixel cell. However, if the transistor is used as a global shutter, it may be desirable that it have a doping profile resembling a transfer gate.

In all embodiments of the invention, the extent to which leakage occurs through the HDR transistor may be controlled by modifying the implant conditions around the transistor, the channel length, the thickness of the gate oxide on the transistor, the off-state voltage of the transistor, any other method of creating leakage through a transistor, modifying the location of the HDR transistor with respect to the photo sensor, and/or any combination of the aforementioned methods of controlling leakage.

BRIEF DESCRIPTION OF THE DRAWINGS

These and other features and advantages of the invention will be better understood from the following detailed description, which is provided in connection with the accompanying drawings, in which:

FIG. 2a is a schematic diagram of a three-transistor (3T) pixel;

FIG. 2b is a schematic diagram of a three-transistor (3T) pixel having an exemplary HDR/leaky transistor according to the invention;

FIG. 3a is a schematic diagram of a four-transistor (4T) pixel;

FIG. 4a is a schematic diagram of a four-transistor (4T) pixel having an in-pixel capacitor;

FIG. 4b is a schematic diagram of a four-transistor (4T) pixel having an in-pixel capacitor and an exemplary HDR transistor according to the invention;

FIG. 12 shows a processor system incorporating at least one imager device constructed in accordance with an embodiment of the invention.

DETAILED DESCRIPTION OF THE INVENTION

Figure 1:
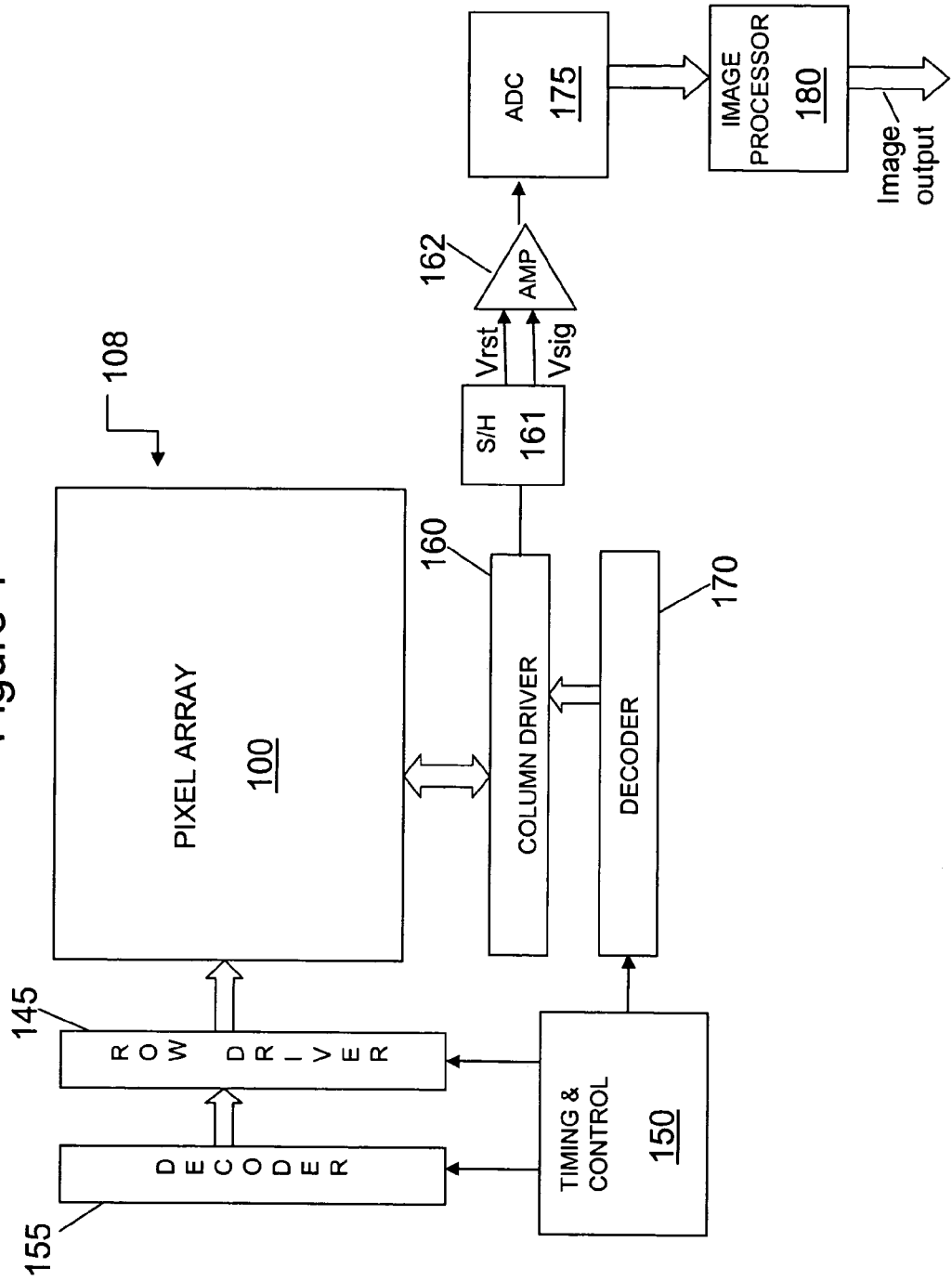
FIG. 1 is a block diagram of an imaging device.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion.

Referring now to the drawings, where like elements are designated by like reference numerals, FIG. 2b illustrates an exemplary three-transistor (3T) pixel 10' constructed in accordance with a first embodiment of the present invention. Although the pixel 10' appears to have the conventional 3T configuration (i.e., pixel 10 of FIG. 2a), the reset transistor 32' is intentionally made leaky (i.e., a small amount of charge is allowed to flow through it) to drain away excess charge from the photosensor 26. As such, the pixel 10' has a higher dynamic range than the conventional pixel; the leaky reset transistor 32' acts as a high dynamic range (HDR) transistor in the illustrated embodiment. The degree of leakage can be controlled by tailoring the leakage, the threshold voltage characteristics of the reset transistor 32', or the voltage applied to the gate of the reset transistor 32'.

Figure 7:
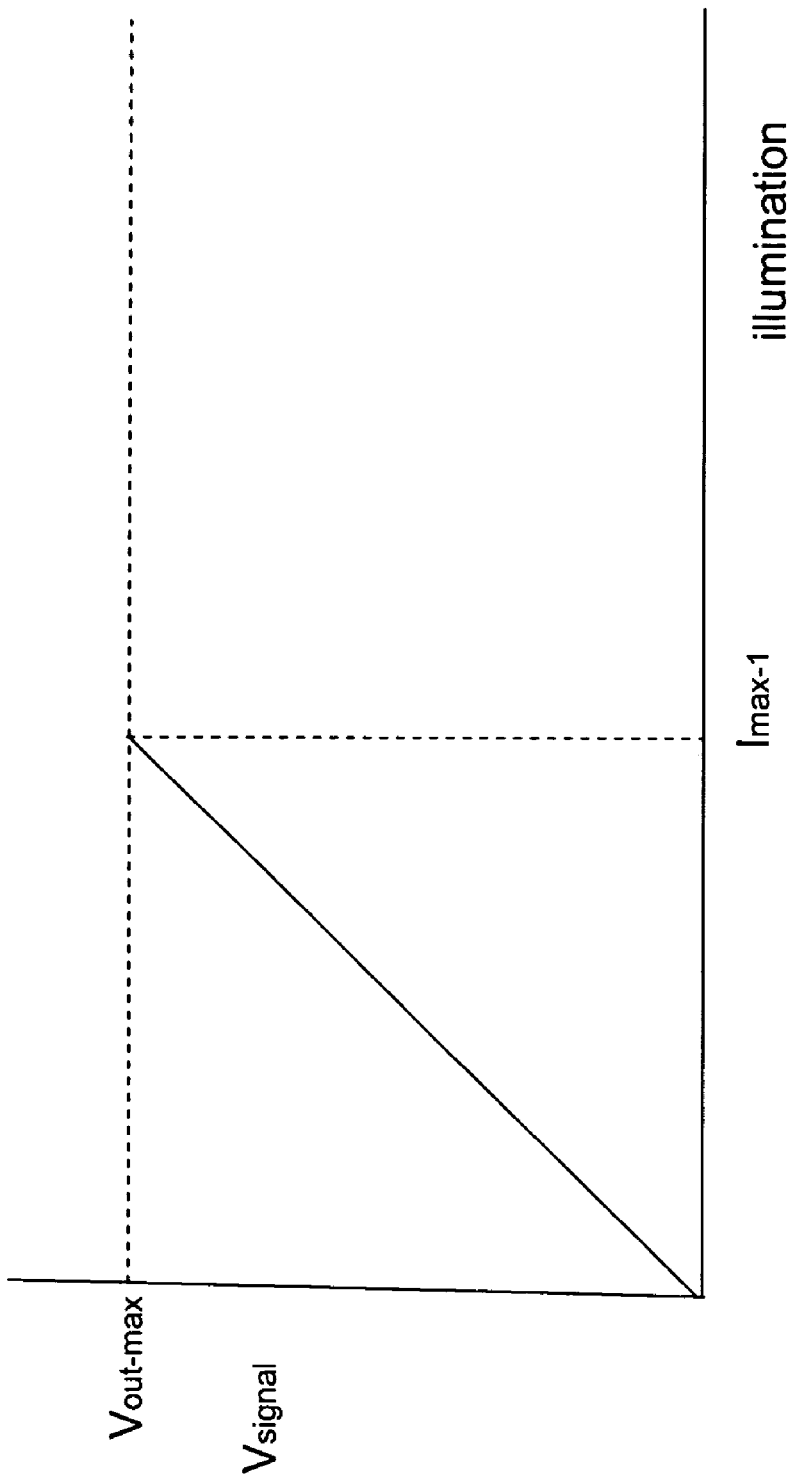
FIG. 7 is an illumination v. voltage graph of a conventional pixel cell.
Figure 8:
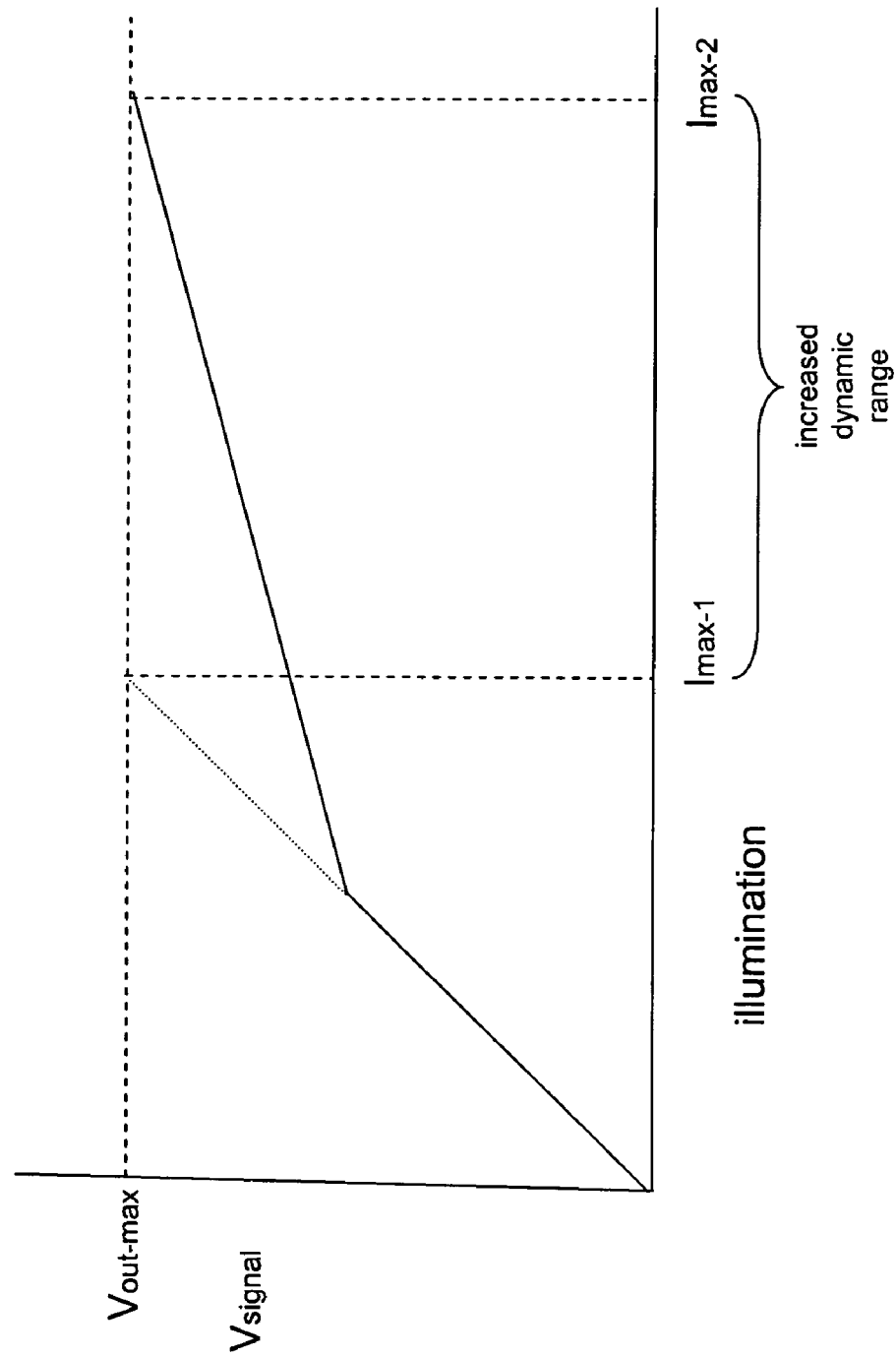
FIG. 8 is an illumination v. voltage graph of a pixel cell constructed in accordance with an embodiment of the invention.

In one operational aspect, the leaky reset transistor 32' operates by creating a "knee" in the illumination-voltage profile of the device, increasing the light dynamic range of the pixel. FIG. 8 illustrates a pixel cell illumination v. output voltage graph in accordance with the present invention. The term "knee" reflects the fact that the "knee" creates an angle in the illumination-voltage profile, such that the maximum saturation voltage $I_{max-2}$ is reached at a greater level of illumination that of the pixel cell of prior art, $I_{max-1}$ as shown in FIG. 7.

In another operational aspect, the reset transistor 32' also acts as a shutter gate or anti-blooming gate. During an integration period of the photosensor 26, the reset transistor 32' may have a gate voltage above 0.0 V applied to it during an integration period to allow a small amount of charge to leak through to the array pixel supply voltage $V_{aa-pix}$. At the end of the integration period (during signal readout), a voltage greater than the threshold voltage Vt of the transistor is applied to it for a short pulse period, allowing any residual charge to be drained out of the photosensor, through the reset transistor 32', and into a charge collection region.

Prior to integration of charge in the photodiode, the reset transistor 32' may be turned on by applying a voltage to the reset transistor 32' which is greater than the $V_t$ of the reset transistor 32'. In this manner charge can be drained out of the photodiode. At the start of the integration period, the reset transistor 32' is turned off, allowing charge to accumulate in the photodiode. In this manner, the reset 32' transistor can act as a global shutter, thus each reset transistor in a pixel controlling the integration of its associated photodiodes and this control may be expected globally throughout a pixel array.

The reset transistor 32' is then turned off to allow integration of the photo-generated charge. If the off-voltage applied to the reset transistor 32' is at 0.0 V or a positive voltage, typically less than the Vt of the reset transistor 32', then this transistor also acts as an anti-blooming gate. That is, under high illumination conditions, the photodiode will fill with charge and excess charge will drain through the reset transistor 32' to the $V_{aa-pix}$.

The reset transistor 32' may have a size and doping profile which is tailored to leak and also operates in a known manner when fully turned on to reset floating diffusion node 28 as described above.

The doping profile of a reset transistor of a conventional pixel may include a "punch-through" protection implant on both sides, which minimizes leakage across the transistor and allows it to maintain better control of its channel. The doping profile of a conventional reset transistor may also include a single lightly doped implant on both sides of the gate. In a conventional pixel cell, the reset transistor may also have a symmetrical channel with either single lightly doped implants or punch-through protection implants on both sides of the gate stack. Alternatively, the reset transistor may have an asymmetrical channel with a single lightly doped implant on one side of the gate stack and a punch-through protection implant on the other side of the gate stack. All of these features are typically provided to prevent leakage from the photosensor 26. A conventional 3T pixel also contain a source follower transistor 34 and a row select transistor 36. The 3T pixel 10' of the present invention also has a photosensor 26, source follower transistor 34, and a row select 36, which operate in a conventional manner.

However, according to the present invention, a certain amount of charge leakage from the photosensor is permitted since over-saturation of the photosensor is a problem of greater concern. Therefore, at least some of the leakage-prevention features mentioned above and associated with reset transistors are eliminated such that the transistor is capable of draining charge away from the photosensor.

In addition, other features of a typical reset transistor may be altered to enhance leakage across the gate. Additionally, a source terminal of the reset transistor 32' may be connected to the array pixel voltage $V_{aa-pix}$ and is designed to permit leakage from the photosensor 26 when the photosensor 26 is at or near saturation. The degree of leakage can be controlled by tailoring the leakage and/or threshold voltage characteristics of transistor 32'.

Figure 3B:
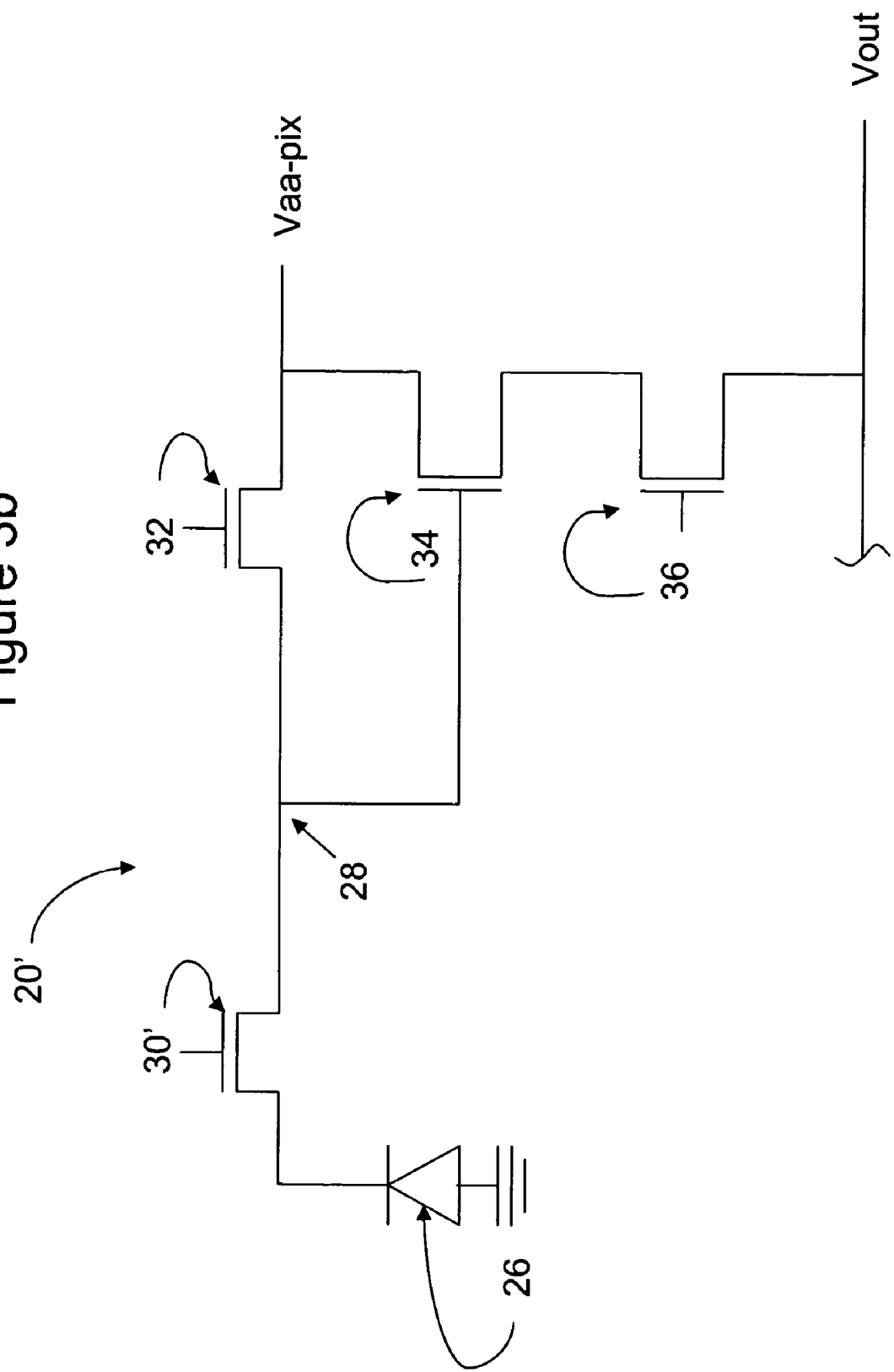
FIG. 3b is a schematic diagram of a four-transistor (4T) pixel having an exemplary HDR/leaky transistor according to the invention.

FIG. 3b illustrates a schematic diagram of an exemplary four-transistor (4T) pixel 20' constructed in accordance with a second exemplary embodiment of the present invention. Although the pixel 20' appears to have the conventional 4T configuration (i.e., pixel 20 of FIG. 3a), the transfer gate 30', like the reset transistor 32' of the 3T pixel 10' depicted in FIG. 2b, is intentionally made leaky to drain away excess charge from the photosensor 26. As such, the pixel 220' has a higher dynamic range than the conventional pixel; the leaky transfer transistor 30' acts as a high dynamic range (HDR) transistor in the illustrated embodiment. The degree of leakage can be controlled as described above with respect to the 3T pixel 10' depicted in FIG. 2b, by tailoring the leakage, the threshold voltage characteristics of the transfer gate 30', or the voltage applied to the gate of the transfer gate 30'. However, the doping profile of a transfer gate of a conventional pixel may only include a "punch-through" protection implant on one side, to minimize leakage across the transistor and maintain control of its channel. The doping profile of a conventional transfer gate may also include a single lightly doped implant on one side of the gate.

In a conventional pixel cell, the transfer gate may also have an asymmetrical channel with either a single lightly doped implant or a punch-through protection implant on one side of the gate stack. All of these features are typically provided to prevent leakage from the photosensor 26. A conventional 4T pixel also contains a reset gate 32, source follower transistor 34 and a row select transistor 36. The 4T pixel 20' of the present invention also has a photosensor 26, source follower transistor 34, and a row select 36, which operate in a conventional manner. Similarly, the 4T pixel 200' (FIG. 4*b*) having a capacitor C connected to its floating diffusion region 228 may also have leakage controlled by leaky transfer gate 230'.

Figure 9:
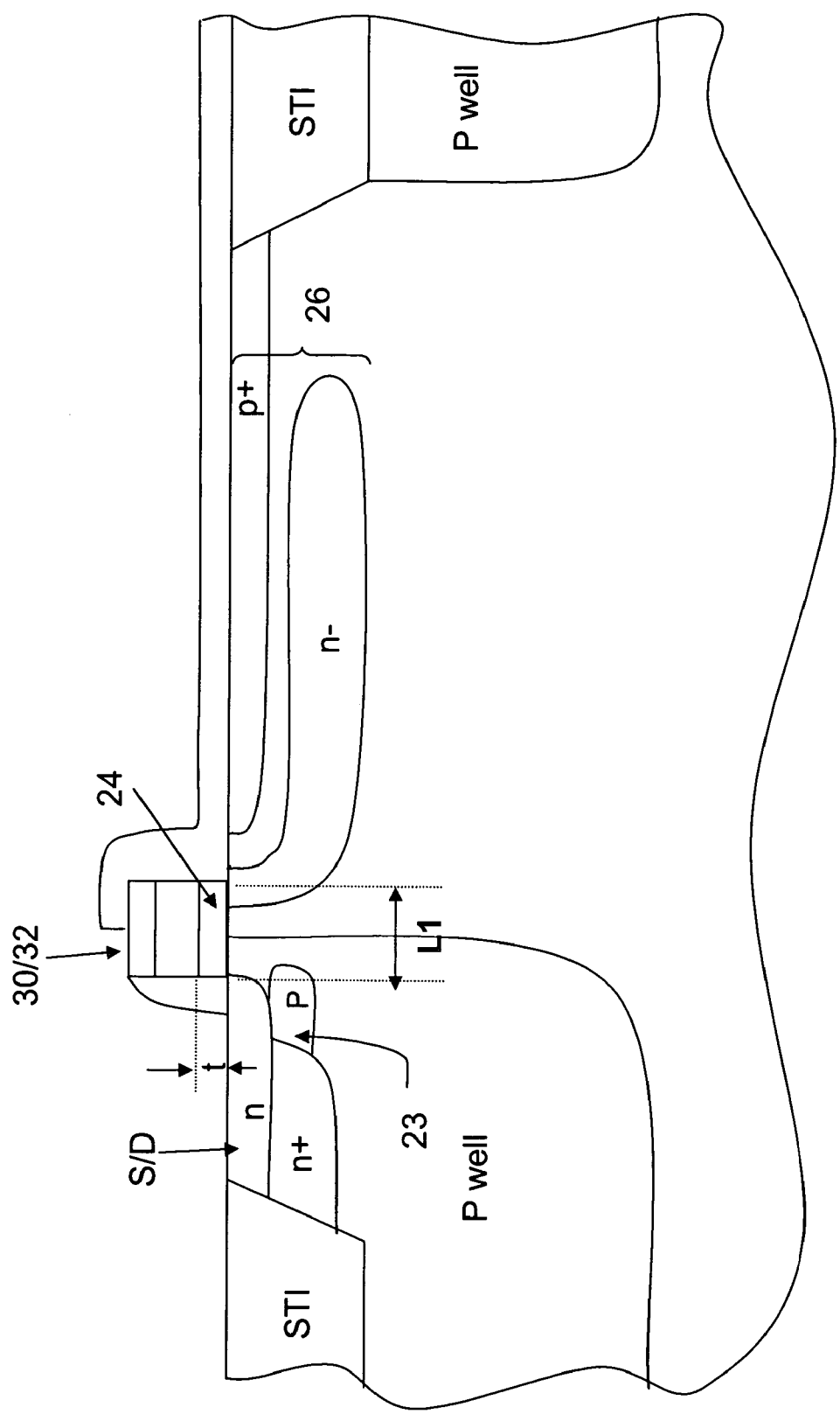
FIG. 9 is a cross section of a pixel cell of prior art.

FIG. 9 is a cross-section of a typical pixel having features to minimize leakage, according to prior art techniques. There are typically boron halo punch-through protection implants 23 on the side of the reset gate 32 opposite the photoconversion device 26. The gate may also be a transfer gate 30, in which case, there may be boron halo punch-through protection implants on both side of the gate. The halo implant 23 is designed to create barriers to charge leakage across the channel.

The length of the channel L1 is about 0.3 μm to about 0.7 μm. This channel length is optimized such that it is short enough to allow the converted charge to transfer to the output circuitry at the end of an integration period, but distances the photoconversion device 26 from the floating diffusion region 28 or readout circuitry to minimize the off-state leakage. Another aspect of the channel is the proximity of lightly-doped drain and source/drain implants S/D to the ends of the channel L1. It should be noted that in order to minimize leakage, these lightly-doped drain and source/drain implants S/D are, at closest, outside of the channel.

Figure 10:
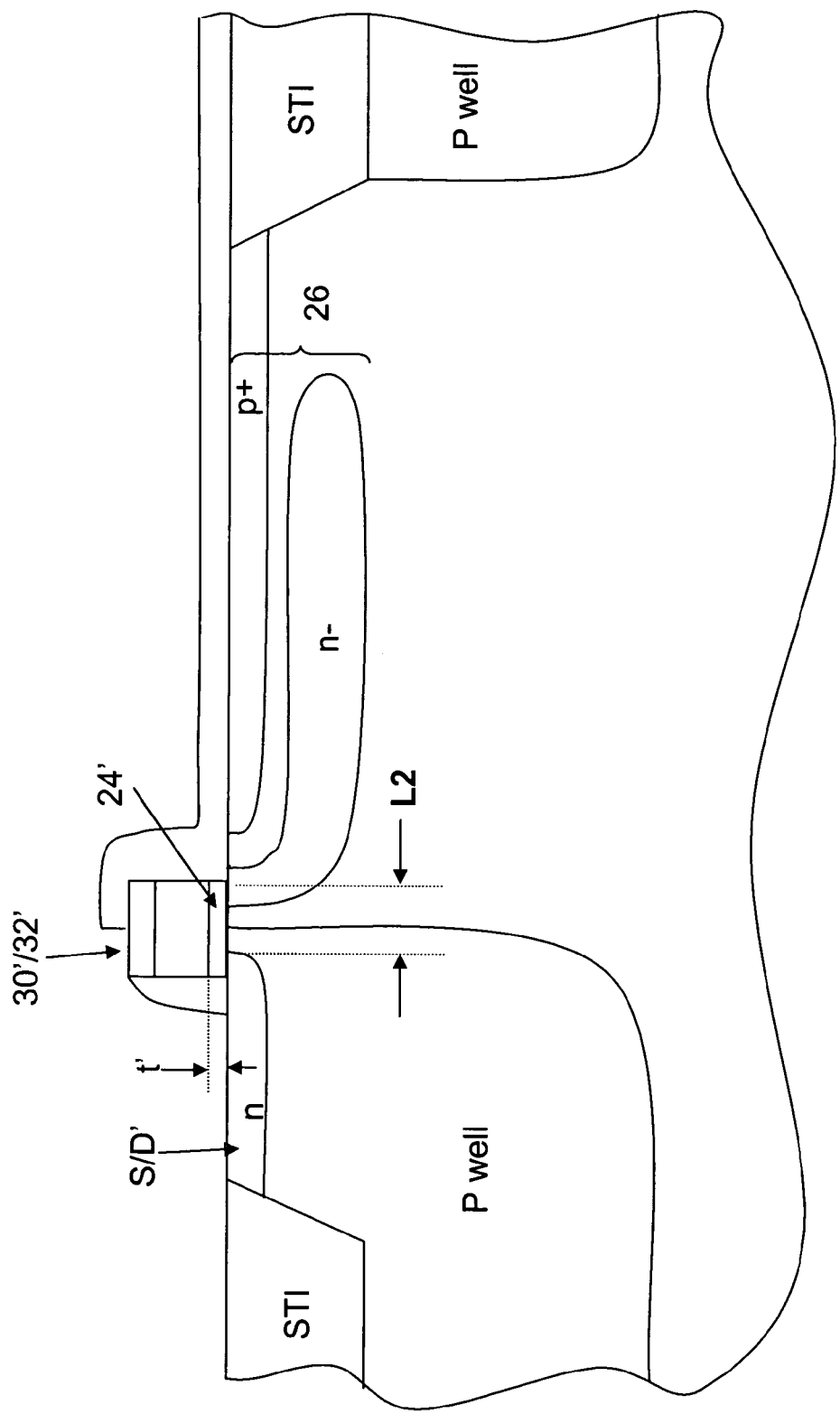
FIG. 10 is a cross section of a pixel cell according to an embodiment of the present invention.

By contrast, FIG. 10 is a cross-section of a pixel according to the present invention. The boron halo punch-through protection implants have been eliminated from the side (or sides, in the case of a transfer gate 30') of the reset gate 32'. Without a halo punch-through protection implant, the channel L2 is free from obstruction for charge transfer and leakage may be partially uninhibited. Also notable is the location of source/drain implants S/D'. They may be angled under the gate 24', thereby shortening the channel length L2, thereby encouraging leakage. The channel length is approximately 0.2 μm to approximately 1.0 μm, preferably within the range of 0.3 μm to 0.7 μm.

In the embodiments illustrated in FIGS. 9 and 10, the reset gate 30' and/or transfer gate transistors 32' served a dual purpose, acting as a reset gate/transfer gate in addition to providing off-state leakage to prevent charge overflow from the photoconversion device by drawing away charges from the photosensor 26. In effect, the reset/transfer gates are also high dynamic range transistors.

Figure 5:
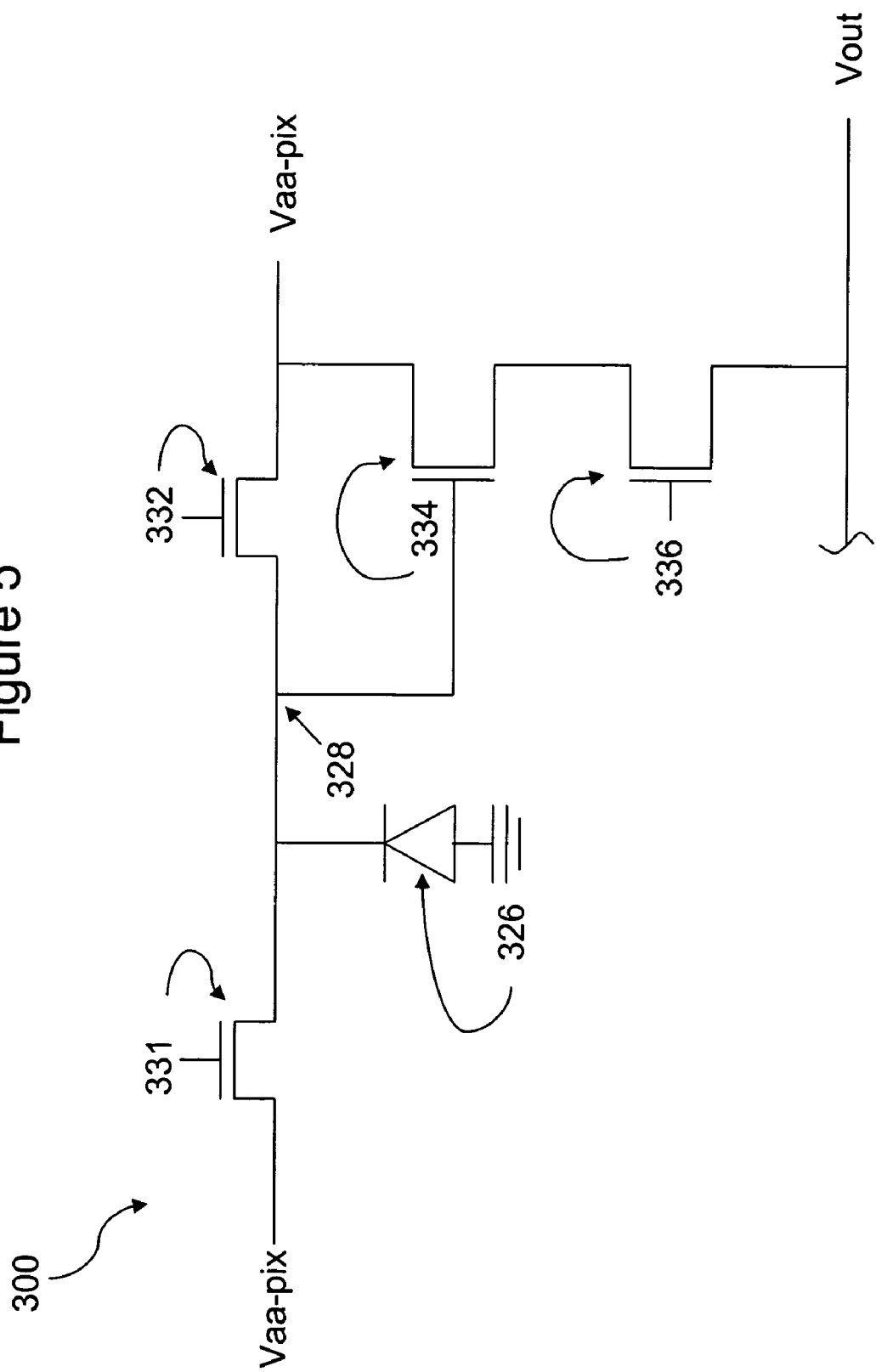
FIG. 5 is a schematic diagram of a 3T pixel modified to include an HDR/leaky transistor according to the invention.
Figure 6:
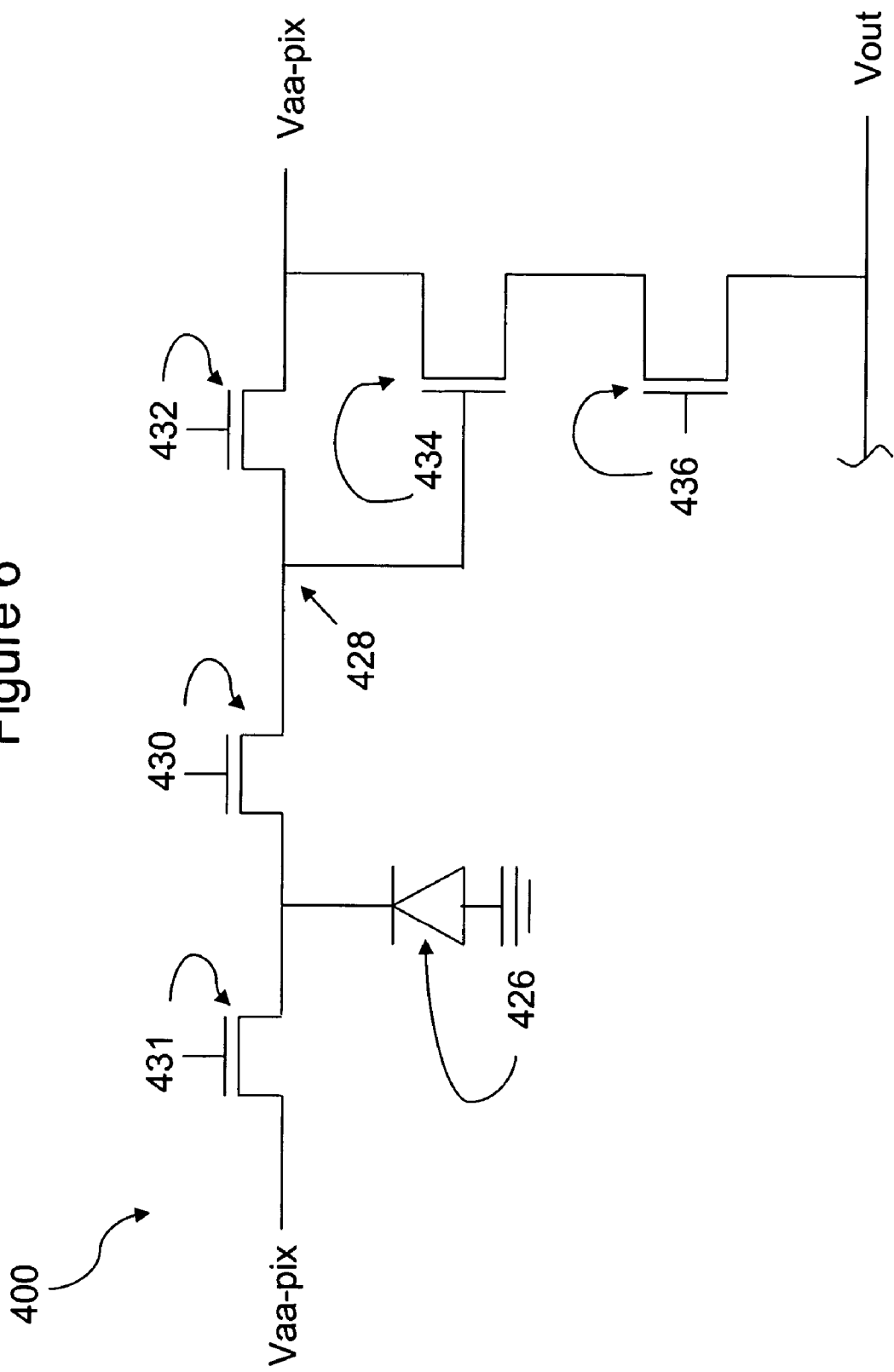
FIG. 6 is a schematic diagram of a 4T pixel modified to include an HDR/leaky transistor according to the invention.

In another embodiment of the present invention, a transistor performing the specific function of extending the dynamic range of the pixel cell, i.e., a high dynamic range (HDR) transistor, is added instead of being made out of the reset or transfer transistors. Therefore, both a reset gate/transfer gate and a high dynamic range transistor are coupled to the photoconversion device to leak charges away from the photoconversion device. In FIG. 5, the HDR transistor 331 is added to a 3T pixel. In FIG. 6, the HDR transistor 431 is added to a 4T pixel.

Figure 11:
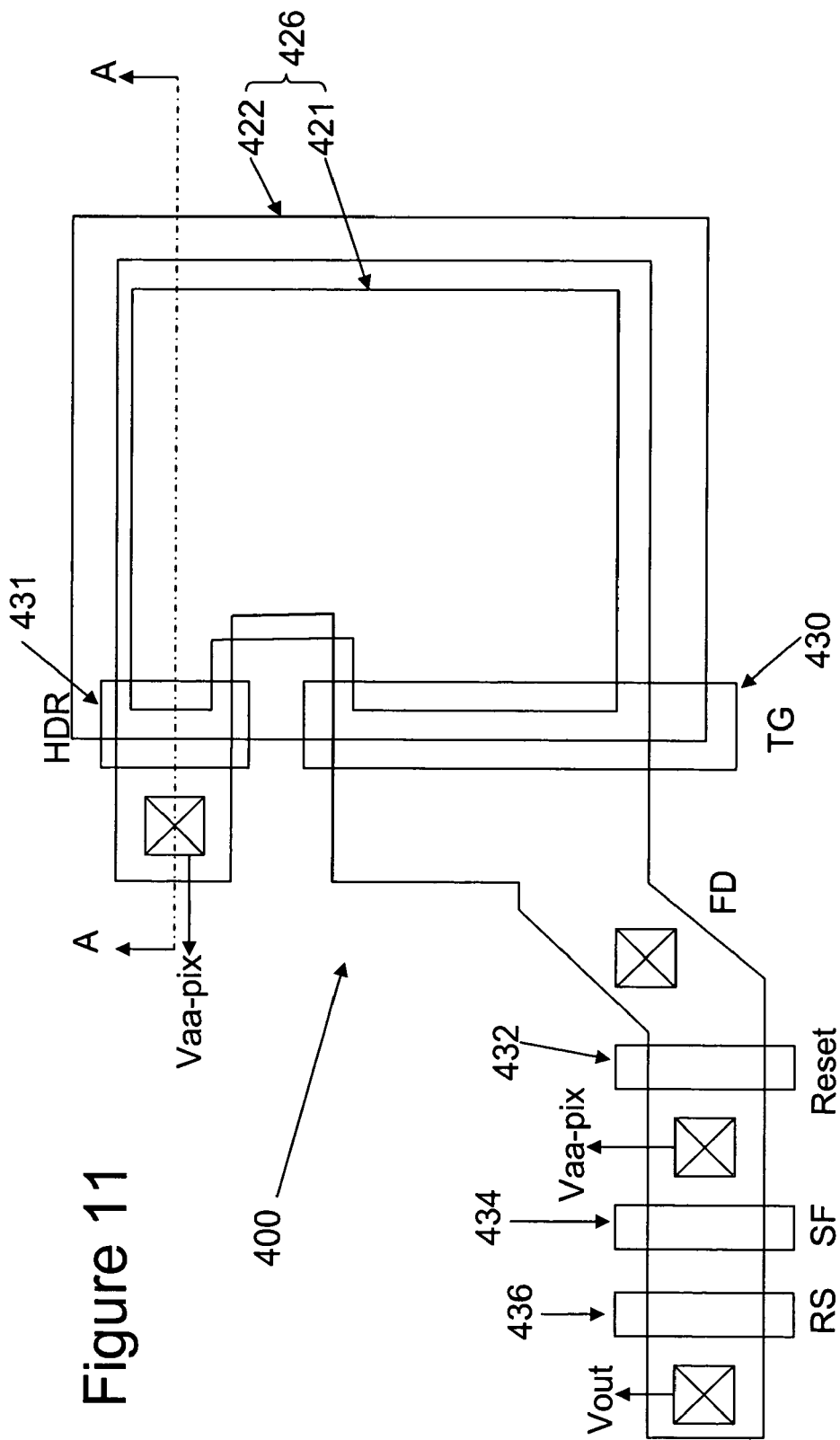
FIG. 11 is a plan view of a pixel cell according to another embodiment of the present invention.

FIG. 11 illustrates a plan view of an embodiment of the present invention, pixel cell 400, including an additional transistor (i.e., HDR transistor 431). The HDR transistor 431 is located on the same side of the photosensor 426 as the transfer gate 430. Additional pixel component layouts are described in further detail in U.S. patent application Ser. No. 10/881,525 to Rhodes. It should also be noted that the invention has equal applicability to p-channel devices formed within an n-type deep implanted region formed below a transistor array.

Conventional processing steps may be employed to form contacts and wiring to connect transistor gate and source and drain regions of the pixel cell of the present invention. For example, the entire surface may be covered with a passivation layer of, e.g., silicon dioxide, BSG, PSG, or BPSG, which is then planarized by chemical mechanical polishing. The passivation layer may then be etched to provide contact holes which are then metallized to provide contacts to the reset gate, transfer gate, source/drain regions and other pixel structures, as needed. Conventional multiple layers of conductors and insulators to other circuit structures may also be used to interconnect the internal structures of the pixel sensor cell and to connect the pixel cell structures to other circuitry associated with the pixel array.

Four (4T) and five-transistor (5T) pixels of the present invention can be used in a pixel array 100 of the imager device 108 illustrated in FIG. 1. FIG. 12 shows a system 2000, a typical processor system modified to include an imager device 108 as in FIG. 1 employing pixels of the present invention and an input device to the system 2000. The imager device 108 may also receive control or other data from system 2000 as well. Examples of processor systems, which may employ the imager device 108, include, without limitation, computer systems, camera systems, scanners, machine vision systems, vehicle navigation systems, video telephones, surveillance systems, auto focus systems, star tracker systems, motion detection systems, image stabilization systems, and others.

System 2000 includes a central processing unit (CPU) 2002 that communicates with various devices over a bus 2004. Some of the devices connected to the bus 2004 provide communication into and out of the system 2000, illustratively including an input/output (I/O) device 2006 and imager device 108. Other devices connected to the bus 2004 provide memory, illustratively including a random access memory system (RAM) 2010, FLASH memory or hard drive 2012, and one or more peripheral memory devices such as a floppy disk drive 2014 and compact disk (CD) drive 2016. Any of the memory devices, such as the FLASH memory or hard drive 2012, floppy disk drive 2014, and CD drive 2016 may be removable. The imager device 108 may be combined with a processor, such as a CPU, digital signal processor, or microprocessor, in a single integrated circuit. The imager device 108 may be a CCD imager or CMOS imager constructed in accordance with any of the illustrated embodiments.

The above description and drawings are only to be considered illustrative of exemplary embodiments which achieve the features and advantages of the invention. Modification of, and substitutions to, specific process conditions and structures can be made without departing from the spirit and scope of the invention. Accordingly, the invention is not to be considered as being limited by the foregoing description and drawings, but is only limited by the scope of the appended claims.

The invention claimed is:

1. A pixel cell comprising:
   a photosensor for producing photo-generated charges during an integration period comprising at least first and second segments; and
   at least a first transistor coupled to said photosensor for draining charges away from said photosensor during one of said segments such that said photosensor has different charge integration characteristics in said first and second integration segments.

2. The pixel of claim 1 further comprising a second transistor coupled to said photosensor for draining charges away from said photosensor.

3. The pixel cell of claim 1, wherein the pixel is a CMOS imager pixel.

4. The pixel cell of claim 3, wherein the CMOS imager pixel is one of 3T, 4T, 5T, 6T, or 7T architectures.

5. The pixel cell of claim 1, wherein the photosensor is one of p-n and n-p photodiodes.

6. The pixel cell of claim 1, wherein the photosensor is a pinned photodiode having a first layer and a second layer.

7. The pixel cell of claim 6, wherein the pinned photodiode is a p-n-p or a n-p-n photodiode.

8. The pixel cell of claim 1, wherein the photosensor is a photogate.

9. The pixel cell of claim 1, wherein the photosensor is a photoconductor.

10. The pixel cell of claim 1, wherein said first transistor resets said photosensor.

11. The pixel cell of claim 1, wherein said first transistor also functions as a gate for transferring charges from said photosensor at the end of said integration period.

12. The pixel cell of claim 1, wherein said first integration segment has a first I-V slope.

13. The pixel cell of claim 12, wherein said first I-V slope is controlled by a first voltage applied to at least said first transistor.

14. The pixel cell of claim 12, wherein said second integration segment has a second I-V slope.

15. The pixel cell of claim 14, wherein said second I-V slope is controlled by a voltage applied to at least said first transistor.

16. The pixel cell of claim 15, wherein at least said first transistor has a voltage of greater than 0.0 V applied to it during said integration period.

17. The pixel cell of claim 1, wherein at least said first transistor is turned on after said integration period.

18. The pixel cell of claim 1, wherein at least said first transistor is turned on before said integration period.

19. The pixel cell of claim 1, wherein said first transistor is also a transfer gate for transferring charges from said photosensor to a storage node.

20. The pixel cell of claim 1, wherein said first transistor is also a reset gate for transferring charges from said photosensor to a voltage supply.

21. The pixel cell of claim 2, wherein said second transistor has a doping profile of a transfer transistor.

22. The pixel cell of claim 2, wherein said second transistor has a doping profile of a reset transistor.

23. The pixel cell of claim 1, further comprising a capacitor connected to a storage region of the pixel cell.

* * * * *